(12) United States Patent
Pinna

(10) Patent No.: US 8,963,755 B2
(45) Date of Patent: Feb. 24, 2015

(54) MULTI-LEVEL SIGMA-DELTA ADC WITH REDUCED QUANTIZATION LEVELS

(71) Applicant: ST-Ericsson SA, Plan-les-Ouates (CH)

(72) Inventor: Carlo Pinna, Milan (IT)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 14/351,111

(22) PCT Filed: Oct. 10, 2012

(86) PCT No.: PCT/EP2012/070076
§ 371 (c)(1),
(2) Date: Apr. 10, 2014

(87) PCT Pub. No.: WO2013/053769
PCT Pub. Date: Apr. 18, 2013

(65) Prior Publication Data
US 2014/0266829 A1    Sep. 18, 2014

Related U.S. Application Data

(60) Provisional application No. 61/549,490, filed on Oct. 20, 2011.

(30) Foreign Application Priority Data

Oct. 13, 2011    (EP) .................................. 11185105

(51) Int. Cl.
*H03M 3/00* (2006.01)

(52) U.S. Cl.
CPC *H03M 3/30* (2013.01); *H03M 3/39* (2013.01); *H03M 3/424* (2013.01); *H03M 3/454* (2013.01)

USPC .......................................... 341/143; 341/155

(58) Field of Classification Search
USPC .................... 341/143, 155, 161, 163
See application file for complete search history.

(56) References Cited

U.S. PATENT DOCUMENTS

| 5,627,536 A | * | 5/1997 | Ramirez | ........................ 341/141 |
| 6,304,608 B1 | | 10/2001 | Chen et al. | |
| 6,927,720 B2 | | 8/2005 | Matsumoto | |

(Continued)

FOREIGN PATENT DOCUMENTS

EP        2141814 A1    1/2010

OTHER PUBLICATIONS

Fraser, et al., "Stability analysis of multiple-feedback oversampled $\Sigma\text{-}\Delta$ A/D converter configurations", 43rd IEEE Midwest Symposium on Circuits and Systems; 200-08-08, pp. 676-679; vol. 2, IEEE.

(Continued)

*Primary Examiner* — Brian Young
(74) *Attorney, Agent, or Firm* — Coats & Bennett, P.L.L.C.

(57) ABSTRACT

A multi-level sigma-delta Analog to Digital converter provides multi-level outputs using a quantizer with reduced quantization levels. The converter comprises a direct path comprising a computation block, an analog integrator, a digital integrator and the quantizer with reduced quantization levels. Further, the converter comprises a feedback path arranged to provide to the computation block a feedback analog signal. The feedback analog signal is injected via the feedback path and the computation block directly at the input terminal of the quantizer. The converter allows reduction of the complexity of the quantizer.

14 Claims, 3 Drawing Sheets

(56) References Cited

U.S. PATENT DOCUMENTS

| | | |
|---|---|---|
| 7,075,995 B2 | 7/2006 | Su |
| 7,423,567 B2 * | 9/2008 | Melanson ............... 341/143 |
| 7,538,705 B2 | 5/2009 | Daval et al. |
| 7,548,178 B2 | 6/2009 | Delano |
| 7,800,524 B2 | 9/2010 | Lee et al. |
| 7,948,414 B2 * | 5/2011 | Lin et al. ............... 341/143 |
| 8,736,473 B2 * | 5/2014 | Dijkmans et al. ......... 341/143 |
| 2003/0081687 A1 | 5/2003 | Su |
| 2005/0093725 A1 | 5/2005 | McDaniel et al. |
| 2007/0210947 A1 | 9/2007 | Delano |
| 2008/0062026 A1 | 3/2008 | Melanson |
| 2008/0150777 A1 | 6/2008 | Rangan et al. |
| 2010/0164769 A1 | 7/2010 | Lee et al. |

OTHER PUBLICATIONS

Bonizzoni et al. "Third Order Sigma-Delta Modulator with 61-dB SNR and MHz Bandwitdth Consuming 6 mW." ESSCIRC 2008; 34th European Solid-State Circuits Conference; XP055020420; Sep. 1, 2008; pp. 218-221.

Pena-Perez et al. "Double-Sampling Analog-Look-Ahead Second Order Sigma-Delta Modulator with Reduced Dynamics." IEEE International Symposium on Circuits and Systems; XP031724395; ISCAS May 30-Jun. 2, 2010; pp. 2422-2425.

* cited by examiner

MULTI-LEVEL SIGMA-DELTA ADC WITH REDUCED QUANTIZATION LEVELS

TECHNICAL FIELD

The present invention relates to Analog-to-Digital Converter circuits (ADCs) and particularly to a multi-level sigma-delta ADC with reduced quantization levels.

BACKGROUND ART

Analog-to-Digital Converter circuits (ADCs) are often implemented with Sigma-Delta topologies when high accuracy is required.

An example of application is in the audio field, where Sigma-Delta ADCs are the most commonly used.

As known, this topology of converters transforms an analog input signal to a digital stream of words with a low number of bits and a spectrally-shaped quantization noise.

The first Sigma-Delta converters had a single bit output (2 levels), then they evolved to multi-level outputs thanks to the usage of new design techniques.

The multi-level solution has the advantage of reducing the quantization noise at the cost of an increased complexity of the ADCs.

For this reason the output bits of these converters are mainly in the range of one (2 levels) to 5 (32 levels) and more rarely they go beyond these numbers.

FIG. 1 shows a multi-level second-order sigma-delta converter 100 of the prior art in which the shown quantizer 101 is L-levels.

The converter 100 of FIG. 1 is arranged to convert an input analog signal X into a stream of digital words Y.

The converter 100 includes a direct path d1 having a first analog integrator 102 and a second analog integrator 103 connected in series one another upstream the quantizer 101. The converter 100 further comprises a feedback path f1 arranged to subtract the digital output signal Y to the input of the first analog converter 102 and the second analog converter 103, respectively.

As known, the quantizer must not introduce delay in the direct path because the delay can cause instability, so the preferred solution to implement the quantizer is to do a flash-converter with a number of comparators equal to the output levels minus one (in this example L−1 comparators).

Other methods are possible to implement this block, but in any case low delay and a L-levels accuracy is required.

In most cases the complexity of the quantizer is the limiting factor for the increase of the number of levels.

An example of multi level sigma-delta AD converter is described in the publication "A 4 Ghz CT Sigma-Delta ADC with 70 dB and −74 dBFS THD in 125 MHz BW", Bolatkale et al., page. 470-417, ISSCC 2011/SESSION 27/OVER-SAMPLING CONVERTER IEEE International Solid-State Circuits Conference.

Document Edoardo Bonizzoni et Al: "Third-Order Siqma-Delta Modulator with 61-dB SNR and 6-MHz Bandwidth consuming 6 mW'" ESSCIRC 2008, 34th European Solid state Circuits Conference, 1 Sep. 2008, pages 218-221, XP55020420, discloses a multi-bit third order Sigma-Delta modulator which uses a reduced number of operational amplifiers and enjoys a swing reductions at the quantizer input.

Document Aldo Pena-Perez et Al: "Double-Samplinq Analoq-look-ahead second order Sigma-Delta Modulator with reduced Dynamics", IEEE INTERNATIONAL SYMPOSIUM ON CIRCUITS AND SYSTEMS.ISCAS 2010 30 May-2 Jun. 2010-PARIS, FRANCE, IEEE, US, 30 May 2010, pages 2422-2425, XP031724395, discloses a second order Sigma-Delta modulator which ensures a reduction of the number of the quantization levels in the quantizer so that to reduce the overall power consumption of the modulator.

Document US2008/062026 A1 describes an Analog-to-Digital converter (ADC) having reduced number of quantizer output levels.

SUMMARY OF THE INVENTION

An object of the present invention is to provide a multi-level sigma-delta AD converter with reduced quantization levels which is alternative to the ones of the cited prior art overcoming at least some of their drawbacks and limitations and reducing the quantizer accuracy needed.

A multi-level sigma-delta AD converter according to the invention comprises a direct path having an input terminal to receive an input analog signal and an output terminal to provide a output digital signal corresponding to said input analog signal. The direct path comprises an analog integrator having an input terminal to receive a first analog signal representative of the input analog signal and a output terminal to provide a second analog signal, a first computation block arranged to receive said second analog signal and to provide a first analog computed signal, a quantizer having a respective input terminal connected to the first computation block to receive the first analog computed signal and a respective output terminal operatively connected to the output terminal of the direct path. The direct path further comprises a digital integrator interposed between the output terminal of the quantizer and the output terminal of the converter. The digital integrator comprises a delay block having an input terminal to receive the output digital signal and an output terminal to provide a delayed digital signal. The converter further comprises a first feedback path arranged to provide to the first computation block a feedback analog signal representative of the delayed digital signal present at the output terminal of the delay block of the digital integrator, said first computation block being arranged to subtract said feedback analog signal from the second analog signal.

An embodiment of the invention is a digital audio device comprising a multi-level sigma-delta AD converter.

BRIEF DESCRIPTION OF THE DRAWINGS

The characteristics and the advantages of the present multi-level sigma-delta AD converter will be better understood from the following detailed description of one embodiment thereof, which is given by way of illustrative and non-limiting example with reference to the annexed drawings, in which.

DETAILED DESCRIPTION OF PREFERRED EMBODIMENTS

Block diagram of a preferred embodiment of a multi-level sigma-delta Analog-to-Digital (AD) converter of the invention can be described with reference to FIG. 2.

A digital audio device (described in the following with reference to FIG. 3) comprises the multi-level sigma-delta AD converter according to the invention.

The digital audio device can be used in any portable equipment with audio signals, e.g. mobile or cellular phone, MP3 players, PDAs (Personal Digital Assistant), portable computers, tablets, and so on.

Figure 1:
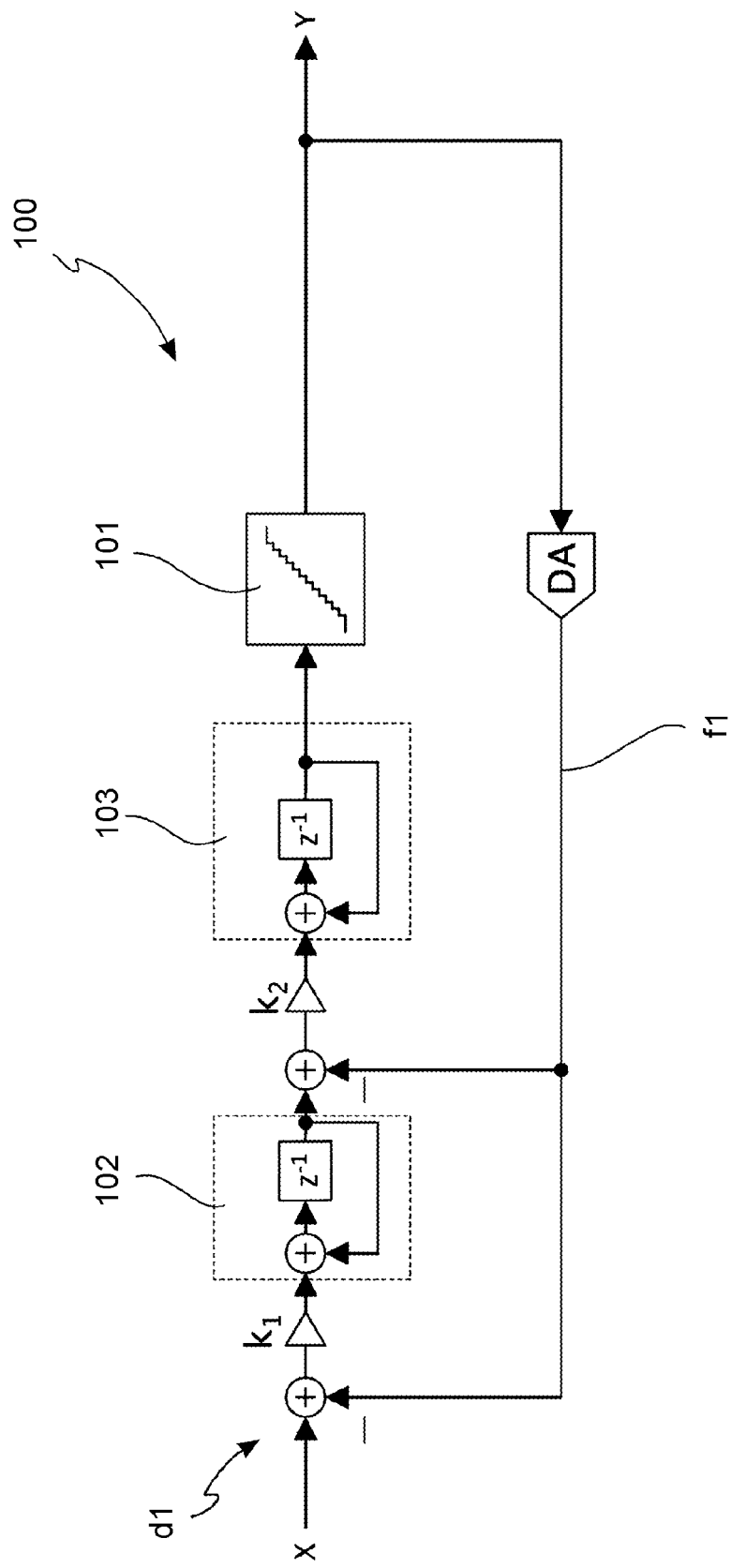
FIG. 1 shows a block diagram of a multi-level sigma-delta AD converter of the prior art.
Figure 2:
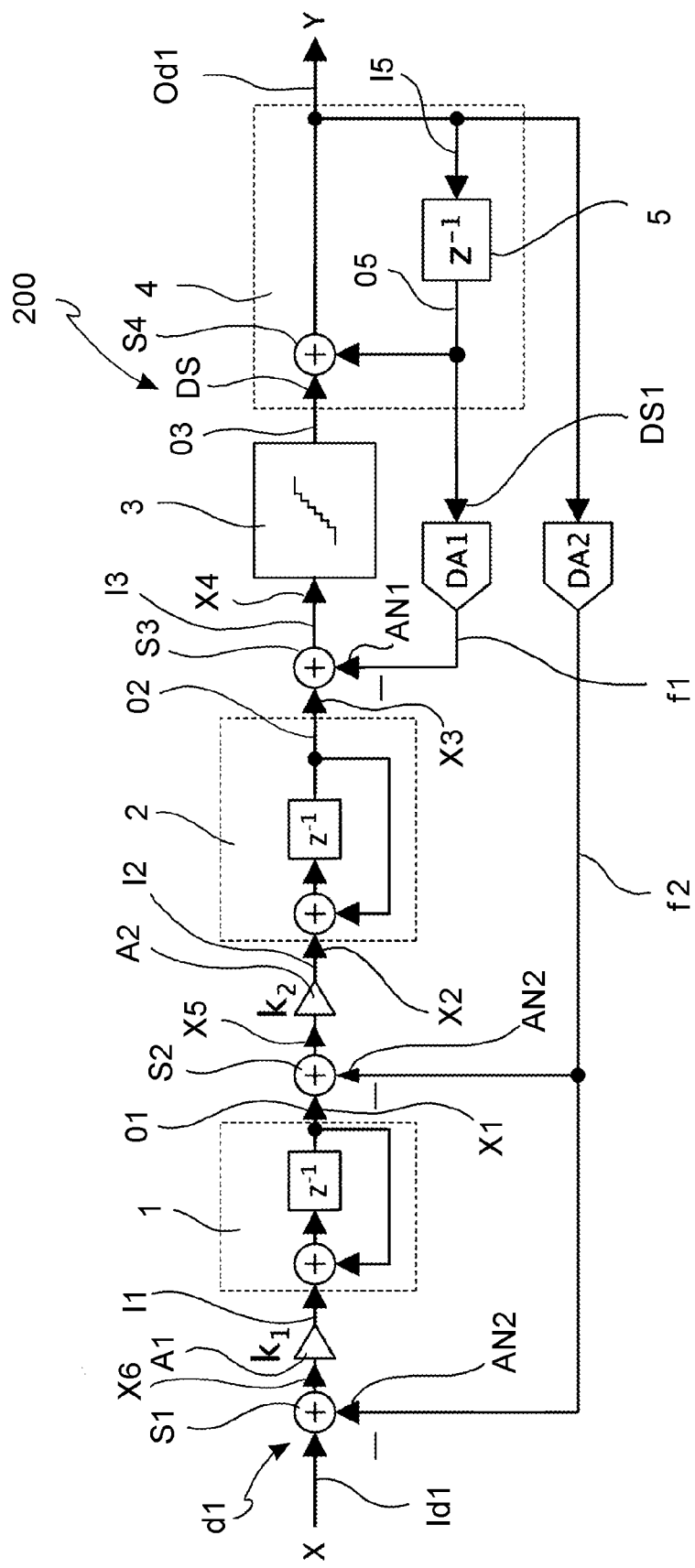
FIG. 2 shows a block diagram of a multi-level sigma-delta AD converter according to an embodiment of the invention.

With reference to FIG. 2, the multi-level sigma-delta AD converter 200, in the following also simply converter 200, comprises a direct path d1 having an input terminal Id1 to receive an input analog signal X and an output terminal Od1 to provide an output digital signal Y corresponding to the input analog signal X.

The output digital signal Y is a digital stream of words with a number of bits depending on the number of levels of the converter 200. As an example, in the case of a 32-level sigma-delta AD converter, the output digital signal Y is a digital stream of words with 5 bits.

The direct path d1 of the converter 200 comprises an analog integrator 2, e.g. a first order analog integrator, having an input terminal 12 receive a first analog signal X2 and an output terminal O2 to provide a third analog signal X3.

As an example of internal block diagram, the analog integrator 2 comprises a respective direct path comprising an adder block and a delay block connected in series one another. The adder block has an input terminal corresponding to the input terminal 12 of the analog integrator 2 and an output terminal connected to the input terminal of the delay block. The delay block has an output terminal corresponding to the output terminal O2 of the analog integrator 2. The analog integrator further comprises a respective feedback path to provide to a further input terminal of the adder block the third analog signal X3 present at the output terminal O2 of the analog integrator 2.

In addition, the direct path d1 of the converter 200 comprises a first computation block S3, e.g. an adder, arranged to receive the second analog signal X3 and to provide a first analog computed signal X4.

Furthermore, the direct path d1 of the converter 200 comprises a quantizer 3 having a respective input terminal 13 connected to the first computation block S3 to receive the first analog computed signal X4 and a respective output terminal O3 operatively connected to the output terminal Od1 of the direct path d1.

It should be noted that, obviously, the portion of the direct path d1 of the converter 200 before the quantizer 3 is in the analog domain and the portion of the direct path d1 of the converter 200 after the quantizer 3 is in the digital domain.

Particularly, the quantizer 3 has a reduced number of quantization levels, e.g. 8 quantization levels, depending on the architecture of the converter 200, as it will be explained in the following.

In particular, according to the invention, the converter 200 is of the L-levels sigma-delta AD type (e.g., L=32) with a quantizer with r-levels (r<L, e.g. r=8). An example of quantizer 3 is a flash converter having a number of comparators equal to r−1.

With reference again to the converter 200, the direct path d1 further comprises a digital integrator 4 interposed between the output terminal O3 of the quantizer 3 and the output terminal Od1 of the converter 200.

The digital integrator 4 is arranged to receive a digital signal DS present at the output terminal O3 of the quantizer 3 and to provide the corresponding output digital signal Y on the output terminal Od1 of the direct path d1 of the converter 200.

In addition, the digital integrator 4 comprises a delay block 5 having an input terminal 15 to receive the output digital signal Y and an output terminal O5 to provide a delayed digital signal DS1.

As an example of its internal block diagram, the digital integrator 4 comprises a respective direct path comprising an adder block. The adder block has an input terminal corresponding to the input terminal of the digital integrator 4 and an output terminal corresponding to the output terminal of the digital integrator 4. The digital integrator 4 further comprises a respective feedback path comprising the delay block 5 arranged to provide to a further input terminal of the adder block the delayed digital signal DS1 corresponding to the output digital signal Y of the converter 200.

With reference again to the converter 200, it advantageously comprises a first feedback path f1 arranged to provide to the first computation block S3 a feedback analog signal AN1 representative of the delayed digital signal DS1 present at the output terminal O5 of the delay block 5 of the digital integrator 4.

In addition, the first computation block S3 is arranged to subtract said feedback analog signal AN1 from the second analog signal X3.

In more detail, in order to do so, the first computation block S3 is preferably configured to change from positive to negative the sign of the feedback analog signal AN1 received from the first feedback path f1 of the converter 200.

In order to convert the delayed digital signal DS1 present at the output terminal O5 of delay block 5 of the digital integrator 4 in a corresponding analog signal to be provided to the first computation block S3, the first feedback path f1 further comprises a Digital-to-Analog (DA) converter DA1, e.g. a flash DA converter, interposed between the output terminal O5 of the delay block 5 of the digital integrator 4 and the first computation block S3.

With reference again to the converter 200, the direct path d1 comprises a second computation block S2 arranged to receive a third analog signal X1 representative of the input analog signal X and to provide a second analog computed signal X5.

The converter 200 further comprises a second feedback path f2 arranged to provide to the second computation block S2 a further feedback analog signal AN2 representative of the output digital signal Y present at the output terminal Od1 of the direct path d1.

The second computation block S2 is advantageously arranged to subtract said further feedback analog signal AN2 from the third analog signal X1.

In more detail, in order to do, the second computation block S2 is preferably configured to change from positive to negative the sign of the further feedback analog signal AN2 received from the second feedback path f2 of the converter 200.

In order to convert the output digital signal Y into the further feedback analog signal AN2 to be provided to the second computational block S2, it should be observed that also the second feedback path f2 comprises a further Digital-to-Analog (DA) converter DA2, e.g. a flash DA converter, interposed between the output terminal Od1 of the direct path d1 of the converter 200 and the second computational block S2.

It should be observed that the direct path d1 of the converter 200 further comprises a first amplification block A2, having a respective gain factor K2, interposed between the second computation block S2 and the first computation block S3.

In the embodiment of the FIG. 2, the first amplification block A2 of the direct path d1 is interposed between the computation block S2 and the analog integrator 2.

According to a further embodiment (not shown in the figure), the first amplification block A2 of the direct path d1 is interposed between the analog integrator 2 and the first computation block S3.

Turning back to the converter 200, the direct path d1 comprises a further analog integrator 1, e.g. a first order analog integrator, having an input terminal I1 operatively connected to the input terminal Id1 of the direct path d1 and an output terminal O1 operatively connected to the second computation block S2 to provide it the third analog signal X1 representative of the input analog signal X of the direct path d1.

As an example, the internal block diagram of the further analog integrator 1 is analogous to the internal block diagram of the analog integrator 2, previously described.

The direct path d1 of the converter 200 further comprises a third computation block S1, e.g. an adder, arranged to receive the input analog signal X and to provide a third analog computed signal X6 to the further analog integrator 1.

The second feedback path f2 of the converter 200 is further arranged to provide the further feedback analog signal AN2 to the third computation block S1.

In addition, the third computation block S1 is arranged to subtract the further feedback analog signal AN2 from the input analog signal X.

In more detail, in order to do so, the third computation block S1 is preferably configured to change from positive to negative the sign of the further feedback analog signal AN2 received from second feedback path f2 of the converter 200.

With reference again to the converter 200, the direct path d1 further comprises a second amplification block A1 interposed between the third computation block S1 and the second computation block S2. The second amplification block A1 has a respective gain factor K1.

In the embodiment of FIG. 2, the second amplification block A1 of the direct path d1 is interposed between the third computation block S1 and the further analog integrator 1.

In accordance with a further embodiment (not shown in the figure), the second amplification block A1 of the direct path d1 is interposed between the further analog integrator 1 and the second computation block S2.

Taking the above considerations into account, the behavior of the converter 200 of the present invention is described below, with reference to the block diagram of the embodiment of FIG. 2.

The input analog signal X of the multi-level sigma-delta AD converter 200 is band limited when used in particular application, e.g. in the audio field.

Therefore, there is a correlation between a sample of the output digital signal Y(N) and the previous one Y(N−1). In other words, the difference between adjacent digital samples is small.

The inventor used this correlation to predict the next digital sample subtracting the predict digital sample present at the output of the quantizer 3 directly before the quantizer 3 so that the quantizer itself can be configured with a reduced number of quantization levels to work properly.

The quantizer 3 introduced an error Err so that the first analog computed signal X4 at the input terminal 13 of the quantizer 3 has amplitude Y-Err.

In the first feedback path f1, the previous output digital sample Y(N−1) (digital output signal DS present at the output terminal O3 of the quantizer 3) is converted in the analog domain by the DA converter DA1 and then subtracted from the third analog signal X3 by the first computation block S3.

In addition, the previous output digital sample Y(N) present at the output terminal Od1 of the direct path d1 of the converter 200 is added back at the output terminal O3 of the quantizer 3 by the digital integrator block 4.

As a result, the first analog computed signal X4 at the input terminal 13 of the quantizer 3 can be written as follows:

$$Y(N)-Y(N-1)-\text{Err}=\Delta Y(N)-\text{Err (first analog computed signal } X4)$$

As known, the output digital signal Y of a multi-level sigma-delta DA converter can be written as a function of the input analog signal X, as follows:

$$Y(N)=f(X(N))+Q(N)$$

wherein f is a signal transfer function and Q represents the noise shaped quantization noise.

It should be noted that in the previous equation it was considered the input analog signal X is a discrete time function X(N) but the same function can be considered as valid also in the case the input analog signal X is a continuous time function X(t).

As a consequence of the previous equation, in the estimation of the amplitude of $\Delta Y(N)$, there are two main terms, as follows:

$$\Delta Y(N)=\Delta f(X(N))+\Delta Q(N)$$

The first term depends on the input analog signal X and on its transfer function. The second term depends on the output quantization noise.

The first term can be small if the transfer function f is a low pass filter or if the input analog signal X is band limited, as in the case of application of the converter in the audio field.

It should be note that, in order to avoid aliasing, the input analog signal X is filtered externally or by its transfer function f and therefore the first term can be small.

The second term is the difference between two successive quantization noises, so it can be assumed that the amplitude of $\Delta Q$ is roughly 2Q.

Then, it should be observed that the amplitude of Q is inversely proportional to the number of output levels L of the L-level sigma-delta AD converter 200 (32 in the example of FIG. 2). Therefore, for a high number L of levels the amplitude of $\Delta Q$ is small.

These considerations can be written as follows:

$$\Delta Q=4Q0/L$$

wherein Q0 is the quantization noise of a converter having 2 output levels.

It should be noted that the same considerations are valid for the error Err introduced by the quantizer, and therefore:

$$\text{Err}=2\text{Err}0/L$$

wherein Err0 is the quantization error of 2 levels quantizer.

In conclusion, the first analog computed signal X4 present at the input terminal 13 of the quantizer 3 can be represented as follows:

$$Y(N)-Y(N-1)-\text{Err}=\Delta f(X(N))+(4Q0+2\text{Err}0)/L$$

If the number of output levels L is big enough the amplitude signal is mainly dependent on the input analog signal X.

In the example of FIG. 2, having a converter 200 with 32 output levels, it is possible to arrange a quantizer 3 having a low number of quantization levels, e.g. 8.

The same quantizer 3 having 8 quantization levels can be used also in the case of a multi-level sigma-delta AD converter having 64 output levels.

Figure 3:
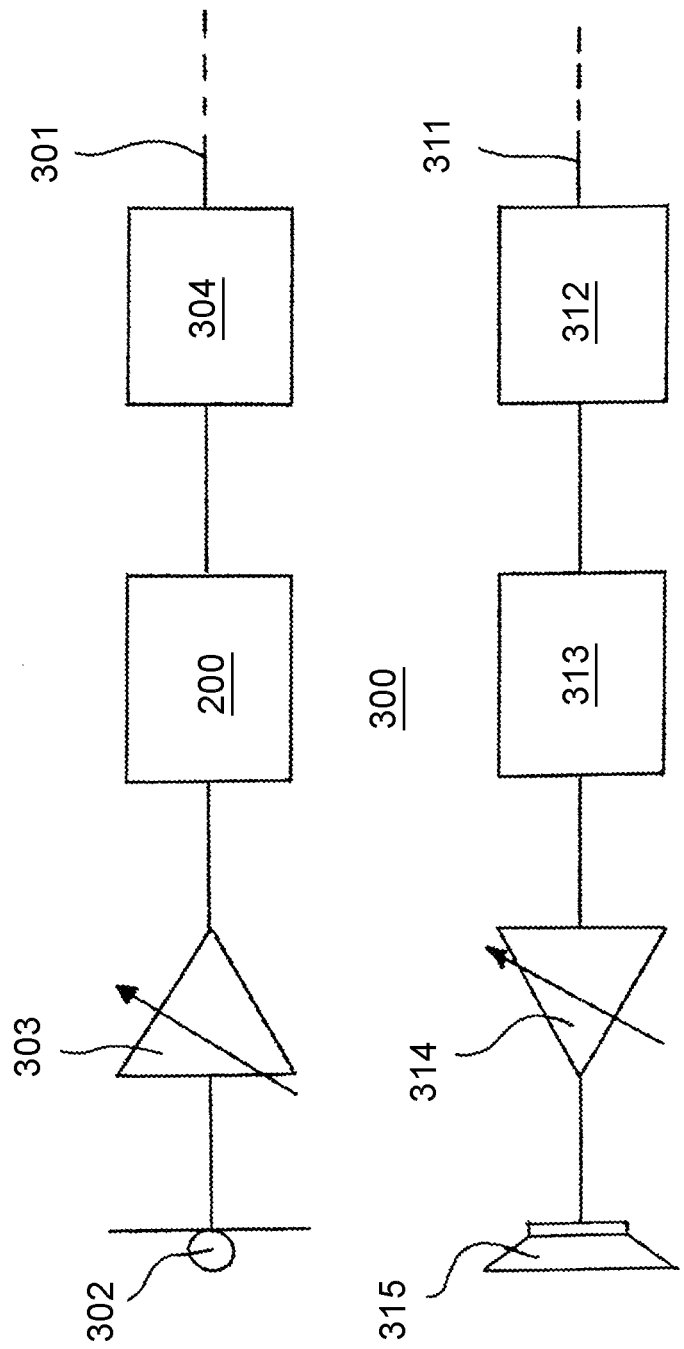
FIG. 3 shows a block diagram of a digital audio device employing the multi-level sigma-delta AD converter according to the invention.

With reference now to FIG. 3, an example of an digital audio device 300 employing the Analog-to Digital converter according to the invention is briefly described.

The digital audio device 300 is for example a mobile telephone. Such digital audio device 300 comprises a digital audio recorder chain 301 and a digital audio player chain 311. The other electronic components of the mobile telephone 300 operatively connected to both the audio chains, are not illustrated in the FIG. 3.

The digital audio recorder chain 301 comprises a microphone 302.

Such digital audio recorder chain 301 further comprises a microphone pre-amplifier 303.

In addition, the digital audio recorder chain 301 comprises an Analog-to-Digital Converter 200 of the type described above with reference to any of the embodiments of the invention.

Moreover, the digital audio recorder chain 301 further comprises a digital filter 304.

The digital audio player chain 311 comprises:
- a further digital filter 312;
- a Digital-to-Analog Converter 313;
- a transducer amplifier 314, and
- a speaker 315.

The multi-level sigma-delta AD converter of the invention has the advantage that the quantizer complexity does not change with the increase of the number of output levels of the converter, as explained above.

Furthermore, the accuracy and complexity of the quantizer 3 is relaxed respect to the other multi-level sigma-delta DA converter already known because its output digital signal (converted in the corresponding analog signal) is injected, via the first feedback path f1 (digital integrator 4 and DA converter DA1) and the first computation block S3, directly at the input terminal 13 of the quantizer 3.

In addition, with respect to the converter of the prior art, the converter of the invention has an alternative arrangement allowing the reduction of the complexity of the quantizer. In addition, the converter of the invention is also simple because it comprises analog integrator of the first order.

The invention claimed is:

1. A multi-level sigma-delta Analog-to-Digital converter comprising:
   a direct path having an input terminal to receive an input analog signal and an output terminal to provide an output digital signal corresponding to said input analog signal, said direct path comprising:
      an analog integrator having an input terminal to receive a first analog signal representative of the input analog signal and an output terminal to provide a second analog signal,
      a first computation block arranged to receive said second analog signal and to provide a first analog computed signal;
      a quantizer having a respective input terminal connected to the first computation block to receive the first analog computed signal and a respective output terminal operatively connected to the output terminal of the direct path,
   wherein said direct path of the converter further comprises a digital integrator interposed between the output terminal of the quantizer and the output terminal of the converter, said digital integrator comprising a delay block having an input terminal to receive the output digital signal and an output terminal to provide a delayed digital signal,
   wherein said direct path further comprises a second computation block arranged to receive a third analog signal representative of the input analog signal and to provide a second analog computed signal,
   the converter further comprising a first feedback path arranged to provide to the first computation block a feedback analog signal representative of the delayed digital signal present at the output terminal of the delay block of the digital integrator, said first computation block being arranged to subtract said feedback analog signal from the second analog signal, the converter being characterized in that said feedback analog signal is injected via the first feedback path and the first computation block directly at the input terminal of the quantizer,
   the converter further comprising a second feedback path, wherein the second feedback path comprises a digital-to-analog converter having an input connected to the output terminal of the direct path and an output connected to second computation block, said input is used to receive the output digital signal present at the output terminal of the direct path.

2. The converter of claim 1, wherein the second feedback path is arranged to provide to the second computation block a further feedback analog signal representative of the output digital signal present at the output terminal of the direct path, said second computation block being arranged to subtract said further feedback analog signal to the third analog signal.

3. The converter of claim 1, wherein the direct path further comprises a first amplification block interposed between the second computation block and the first computation block.

4. The converter of claim 3, wherein the first amplification block is interposed between second computation block and the analog integrator.

5. The converter of claim 3, wherein the first amplification block is interposed between the analog integrator and the first computation block.

6. The converter of claim 1, wherein the direct path further comprises a further analog integrator having an input terminal operatively connected to the input terminal of the direct path and an output terminal operatively connected to the second computation block to provide it the third analog signal representative of the input analog signal.

7. The converter of claim 6, wherein the direct path further comprises a third computation block arranged to receive the input analog signal and to provide a third analog computed signal to the further analog integrator.

8. The converter of claim 7, wherein the second feedback path is further arranged to provide the further feedback analog signal to the third computation block, said third computation block being arranged to subtract the further feedback analog signal from the input digital signal.

9. The converter of claim 8, wherein the direct path further comprises a second amplification block interposed between the third computation block and the second computation block.

10. The converter of claim 9, wherein the second amplification block is interposed between the third computation block and the further analog integrator.

11. The converter of claim 9, wherein the second amplification block is interposed between the further analog integrator and the second computation block.

12. The converter of claim 7, wherein the first computation block, the second computation block and the third computation block are configured to change from positive to negative the sign of the feedback analog signals received from the feedback paths.

13. The converter of claim 1, wherein the first feedback path further comprises a digital-to-analog converter interposed between the output terminal of the delay block of the digital integrator and the first computation block.

14. A digital audio device comprises the converter of claim 1.

* * * * *